US008165550B2

(12) United States Patent
Fujii et al.

(10) Patent No.: US 8,165,550 B2
(45) Date of Patent: Apr. 24, 2012

(54) LOCAL OSCILLATOR, RECEIVER, AND ELECTRONIC DEVICE

(75) Inventors: Takeshi Fujii, Osaka (JP); Yasuo Ooba, Shiga (JP); Mineyuki Iwaida, Kyoto (JP); Hiroaki Ozeki, Osaka (JP)

(73) Assignee: Panasonic Corporation, Osaka (JP)

( * ) Notice: Subject to any disclaimer, the term of this patent is extended or adjusted under 35 U.S.C. 154(b) by 412 days.

(21) Appl. No.: 12/282,080

(22) PCT Filed: Mar. 7, 2008

(86) PCT No.: PCT/JP2008/000487
§ 371 (c)(1),
(2), (4) Date: Sep. 8, 2008

(87) PCT Pub. No.: WO2008/123016
PCT Pub. Date: Oct. 16, 2008

(65) Prior Publication Data
US 2010/0267352 A1 Oct. 21, 2010

(30) Foreign Application Priority Data

Mar. 9, 2007 (JP) ................................. 2007-059450

(51) Int. Cl.
*H04B 1/06* (2006.01)
*H04B 7/00* (2006.01)

(52) U.S. Cl. ...................... 455/255; 455/180.3; 331/151
(58) Field of Classification Search .......... 455/255–265, 455/180.3; 331/151, 169–171, 117 D, 107 DP
See application file for complete search history.

(56) References Cited

U.S. PATENT DOCUMENTS

| 7,053,726 B2 | 5/2006 | Hino |
| 7,321,271 B2 | 1/2008 | Takinami et al. |
| 7,512,390 B2 * | 3/2009 | Lee et al. ...................... 455/260 |
| 2005/0190002 A1 | 9/2005 | Takinami et al. |
| 2005/0270114 A1 | 12/2005 | Hino |

FOREIGN PATENT DOCUMENTS

| JP | 2001-160712 | 6/2001 |
| JP | 2001-339301 | 12/2001 |
| JP | 2001-352218 | 12/2001 |
| JP | 2004-056720 A | 2/2004 |
| JP | 2004-72650 A | 3/2004 |
| JP | 2004-147310 A | 5/2004 |
| JP | 2005-117428 | 4/2005 |
| WO | 2005-101664 | 10/2005 |

OTHER PUBLICATIONS

International Search Report for PCT/JP2008-000487, May 30, 2008.

* cited by examiner

*Primary Examiner* — Christian Hannon
(74) *Attorney, Agent, or Firm* — Pearne & Gordon LLP

(57) ABSTRACT

A broad oscillation frequency range and good phase noise characteristic are achievable simultaneously by an oscillation circuit and a resonance circuit connected to the oscillation circuit. The resonance circuit includes an inductor element connected to the oscillation circuit, a first variable capacitance section connected to the inductor element, and a second variable capacitance section connected in parallel to the first variable capacitance section. The first variable capacitance section includes a first variable capacitive element connected to the inductor element, and a second variable capacitive element connected in parallel to the first variable capacitive element. The first variable capacitive element changes its capacity value based on a control voltage and a first reference voltage. The second variable capacitive element changes its capacity value based on the control voltage and a second reference voltage. The first reference voltage and the second reference voltage are controlled based on the capacity value of the second variable capacitance section.

7 Claims, 9 Drawing Sheets

FIG. 7
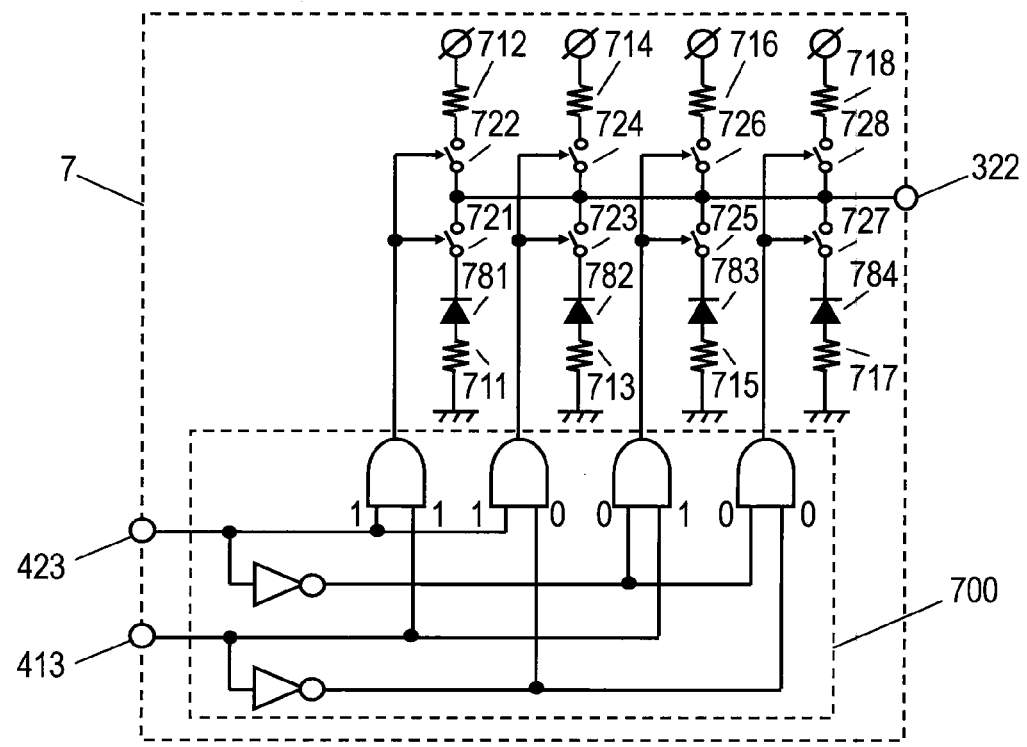
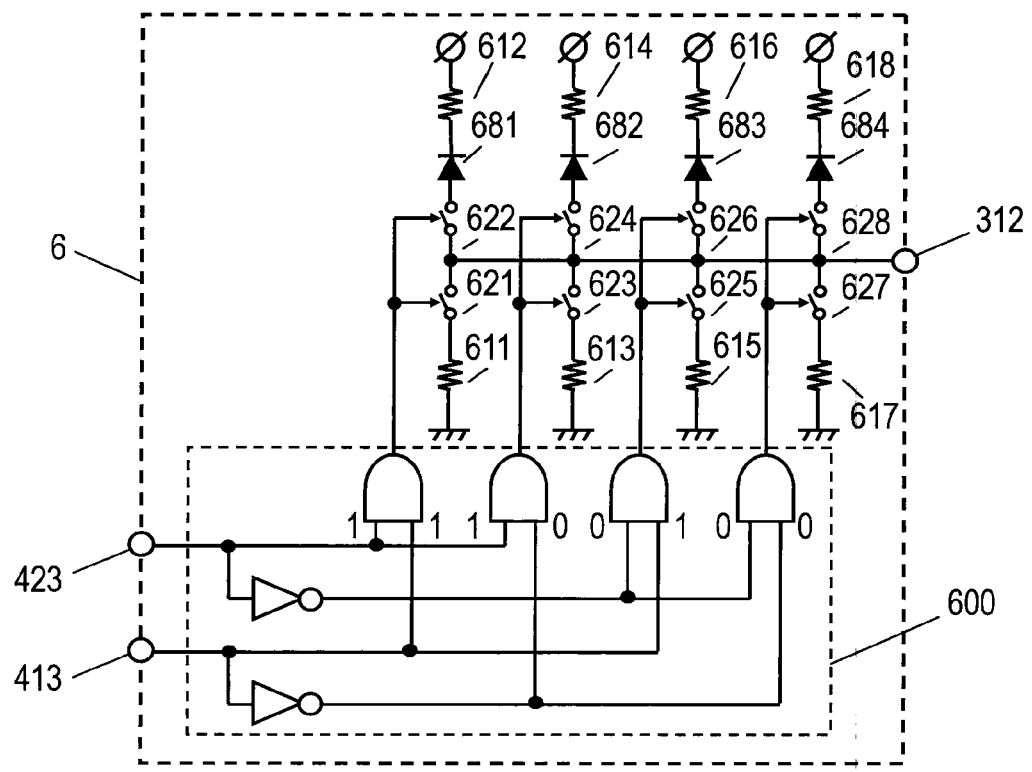

PRIOR ART        FIG. 9

LOCAL OSCILLATOR, RECEIVER, AND ELECTRONIC DEVICE

TECHNICAL FIELD

The present invention relates to local oscillators, and receivers and electronic devices using a local oscillator.

BACKGROUND ART

A conventional local oscillator disclosed in Patent Document 1 is described with reference to FIG. 9. In FIG. 9, conventional oscillator 10 includes oscillation circuit 2 and resonance circuit 30 connected to this oscillation circuit 2. Oscillation circuit 2 and resonance circuit 30 are connected in a loop with PLL circuit 60.

Resonance circuit 30 includes inductor elements 20a and 20b connected to oscillation circuit 2. Inductor elements 20a and 20b are connected to series, and their contact point is connected to VCC. Resonance circuit 30 includes first variable capacitance section 330 connected in parallel to inductor elements 20a and 20b, and second variable capacitance section 430 connected in parallel to this first variable capacitance section 330. First variable capacitance section 330 is connected in parallel to inductor elements 20a and 20b, and includes variable capacitive elements 310a and 210b that change a capacity value based on control voltage supplied from control voltage input terminal 35 and reference voltage $V_{REF}$ supplied from reference voltage supply 500 and capacitive elements 311a and 311b connected in series to this variable capacitive element 310. Variable capacitive elements 310a and 310b are connected in series, and their contact point is connected to reference voltage supply 500. Variable capacitive element 310a and capacitive element 311a, and variable capacitive element 310b and capacitive element 311b are connected in series, respectively. Their contact points are connected to control voltage input terminal 35. Variable capacitive element 310a and capacitive element 311a, and variable capacitive element 310b and capacitive element 311b configure variable capacitance circuits 31a band 31b, respectively.

Second variable capacitance section 430 includes first capacitance switch circuits 41a and 41b connected in parallel to inductor elements 20a and 20b, and second capacitance switch circuits 42a and 42b connected in parallel to these first capacitance switch circuits 41a and 41b. First capacitance switch circuit 41a includes capacitive element 410a and first switch 411a connected in series to this capacitive element 410a. This first switch 411a is switched between on and off by a signal supplied from first capacitance control terminal 413. In the same way, first capacitance switch circuit 41b includes capacitive element 410b and first switch 411b connected in series to this capacitive element 410b. This first switch 411b is switched on and off by a signal supplied from first capacitance control terminal 413. First switches 411a and 411b are connected in series, and their contact point is connected to GND. Second capacitance switch circuit 42a includes capacitive element 420a and second switch 421a connected in series to this capacitive element 420a. This second switch 21a is switched between on and off by a signal supplied from second capacitance control terminal 423. In the same way, second capacitance switch circuit 42b includes capacitive element 420b and second switch 421b connected in series to this capacitive element 420b. This second switch 421b is switched between on and off by a signal supplied from second capacitance control terminal 423. Second switches 421a and 421b are connected in series, and their contact point is connected to GND.

A characteristic of oscillation frequency of local oscillator 10 as configured above is described next with reference to FIGS. 9 and 10.

In FIG. 9, the frequency of the oscillation signal from local oscillator 10 is the resonance frequency of resonance circuit 30. This resonance frequency is determined by first variable capacitance section 330, second variable capacitance section 430, and inductors 20a and 20b. The capacity values of variable capacitive elements 310a and 310b provided in first variable capacitance section 330 are determined by the reference voltage supplied from reference voltage supply 500 and the control voltage supplied from control voltage input terminal 35. The capacity value of second variable capacitance section 430 is determined by how many of capacitive elements 410a and 410b and capacitive elements 420a and 420b are connected in parallel by the on-and-off combination of first switches 411a and 411b and second switches 421a and 421b.

A control signal output from frequency-adjusting circuit 670 of PLL 600 is used for controlling first switches 411a and 411b and second switches 421a and 421b. This frequency-adjusting circuit 670 compares the frequency difference between output signal $f_{DIV}$ of oscillation-frequency divider 610 and output signal $f_{REF}$ of reference-frequency divider 630, and determines a capacity value that minimizes the frequency difference between $f_{DIV}$ and $f_{REF}$. Frequency-adjusting circuit 670 then examines the combination of capacitive elements 410a and 410b and capacitive elements 420a and 420b, and controls first switches 411a and 411b and second switches 421a and 421b via first and second capacitance control terminals 413 and 423. This structure achieves a broad oscillation frequency range.

FIG. 10 is a graph illustrating frequency characteristic, which shows the relationship between first variable capacitance control voltage ($V_T$) applied to control voltage input terminal 35 and oscillation frequency ($f_{OSC}$) of local oscillator 10 in FIG. 9. Bands 1 to 4 show the characteristic of $V_T$ vs. $f_{OSC}$ when first switches 411a and 411b and second switches 421a and 421b are turned on and off in four combinations.

In Band 1, in which $f_{OSC}$ is the lowest, first switches 411a and 411b and second switches 421a and 421b are all turned on, and thus the capacity value of second variable capacitance section 430 is the sum of capacitive elements 410a and 410b and capacitive elements 420a and 420b. On the other hand, in Band 4, in which $f_{OSC}$ is the highest, first switches 411a and 411b and second switches 421a and 421b are all turned off, so the capacity value of second variable capacitance section 430 is approximately 0. In Bands 2 and 3, in which $f_{OSC}$ against $V_T$ is between Band 1 and Band 4, only one of first switches 411a and 411b and second switches 421a and 421b is turned on. The capacity value of second variable capacitance section 430 becomes capacity value $C_{SW1}$ of capacitive element 410a or 410b, or capacity value $C_{SW2}$ of capacitive element 420a or 420b. If the capacity values of capacitive elements 410a and 410b and capacitive elements 420a and 420b are $C_{SW1} > C_{SW2}$, the characteristic of Band 2 is that only first switches 411a and 411b are turned on, and the characteristic of Band 3 is that only second switches 421a and 421b are turned on.

Oscillation frequencies $f_{OSC1}$ to $f_{OSC4}$ of Bands 1 to 4 are expressed by Formulae 1 to 4.

$$f_{OSC1} = \frac{1}{2\pi\sqrt{L\left\{(C_{SW1} + C_{SW2}) + \frac{C1 \cdot C_{VT}}{C1 + C_{VT}}\right\}}} = \quad \text{[Formula 1]}$$

$$\frac{1}{2\pi\sqrt{L\left(\frac{3}{2}C_{SW1} + \frac{C1(\alpha V_T + \beta)}{C1 + \alpha V_T + \beta}\right)}}$$

$$f_{OSC2} = \frac{1}{2\pi\sqrt{L\left\{(C_{SW1}) + \frac{C1 \cdot C_{VT}}{C1 + C_{VT}}\right\}}} = \quad \text{[Formula 2]}$$

$$\frac{1}{2\pi\sqrt{L\left(C_{SW1} + \frac{C1(\alpha V_T + \beta)}{C1 + \alpha V_T + \beta}\right)}}$$

$$f_{OSC3} = \frac{1}{2\pi\sqrt{L\left\{(C_{SW2}) + \frac{C1 \cdot C_{VT}}{C1 + C_{VT}}\right\}}} = \quad \text{[Formula 3]}$$

$$\frac{1}{2\pi\sqrt{L\left(\frac{1}{2}C_{SW1} + \frac{C1(\alpha V_T + \beta)}{C1 + \alpha V_T + \beta}\right)}}$$

$$f_{OSC4} = \frac{1}{2\pi\sqrt{L\frac{C1 \cdot C_{VT}}{C1 + C_{VT}}}} = \frac{1}{2\pi\sqrt{L\frac{C1(\alpha V_T + \beta)}{C1 + \alpha V_T + \beta}}} \quad \text{[Formula 4]}$$

Frequency control sensitivity $df_{OSC1}/dV_T$ to $df_{OSC4}/dV_T$, which are gradients of $V_T$ vs. $f_{OSC}$ in bands 1 to 4 are expressed by the following formulae 5 to 8.

$$df_{OSC1}/dV_T = \frac{-\alpha \cdot C1^2}{4\pi\sqrt{L}\sqrt{C1 + \alpha V_T + \beta}} \quad \text{[Formula 5]}$$
$$\left\{\frac{3}{2}C_{SW1}(C1 + \alpha V_T + \beta) + C1(\alpha V_T + \beta)\right\}^{\frac{3}{2}}$$

$$df_{OSC2}/dV_T = \frac{-\alpha \cdot C1^2}{4\pi\sqrt{L}\sqrt{C1 + \alpha V_T + \beta}} \quad \text{[Formula 6]}$$
$$\{C_{SW1}(C1 + \alpha V_T + \beta) + C1(\alpha V_T + \beta)\}^{\frac{3}{2}}$$

$$df_{OSC3}/dV_T = \frac{-\alpha \cdot C1^2}{4\pi\sqrt{L}\sqrt{C1 + \alpha V_T + \beta}} \quad \text{[Formula 7]}$$
$$\left\{\frac{1}{2}C_{SW1}(C1 + \alpha V_T + \beta) + C1(\alpha V_T + \beta)\right\}^{\frac{3}{2}}$$

$$df_{OSC4}/dV_T = \frac{-\alpha \cdot C1^2}{4\pi\sqrt{L}\sqrt{C1 + \alpha V_T + \beta}\{C1(\alpha V_T + \beta)\}^{\frac{3}{2}}} \quad \text{[Formula 8]}$$

Next, the relationship of frequency control sensitivity $df_{OSC1}/dV_T$ to $df_{OSC4}/dV_T$ of bands 1 to 4, based on formulae 5 to 8, can be expressed by formula 9.

$$df_{OSC4}/dV_T > df_{OSC3}/dV_T > df_{OSC2}/dV_T > df_{OSC1}/dV_T \quad \text{[Formula 9]}$$

whereas, a value of each element of resonance circuit 30 in the above Formula 1 to Formula 9 is:
- L: Inductance of inductor elements 20a and 20b;
- C1: Capacity value of capacitive elements 311a and 311b;
- $C_{VT}$: Capacity value when control voltage $V_T$ is applied to the control voltage input terminals of variable capacitive elements 310a and 310b (=$\alpha Vt+\beta$, $\alpha$ and $\beta$ are coefficients simplifying variable capacity value $C_{VT}$ against a change in control voltage); and
- $C_{SW1}=C_{SW2}/2$: The relationship between capacity value $C_{SW1}$ of capacitive elements 410a and 410b and capacity value $C_{SW2}$ of capacitive elements 420a and 420b.

As shown in FIG. 10 and Formula 9, the frequency control sensitivity, which is a gradient of $V_T$ vs. $f_{OSC}$ of bands 1 to 4, in this conventional local oscillator 10 becomes higher for a band with higher oscillation frequency $f_{OSC}$. In a band with high frequency control sensitivity, $f_{OSC}$ fluctuates by voltage noise superimposed on control voltage $V_T$, and thus a phase noise of local oscillator 10 degrades.

In recently-popular broadcast receiving systems and communications systems that employ digital modulation, a local oscillator with next features are demanded: A broad oscillation frequency range for handling multiple divided frequency bands, and good phase noise characteristic that does not degrade a bit-error rate even if signals are phase-modulated to multiple values for achieving high-quality image, sound, and data.

Patent Document Japanese Patent No. 3488180

SUMMARY OF THE INVENTION

The present invention solves these disadvantages, and offers a local oscillator that can achieve both a broad oscillation frequency range and good phase noise characteristic.

To achieve this object, the local oscillator of the present invention includes an oscillation circuit and a resonance circuit connected to this oscillation circuit. This resonance circuit includes an inductor element connected to the oscillation circuit, a first variable capacitance section connected to this inductor element, and a second variable capacitance section connected in parallel to this first variable capacitance section. The first variable capacitance section includes a first variable capacitive element connected to the inductor element, and a second variable capacitive element connected in parallel to this first variable capacitive element. The first variable capacitive element changes its capacity value based on control voltage and first reference voltage, and the second variable capacitive element changes its capacity value based on the control voltage and second reference voltage. In the local oscillator of the present invention, the first reference voltage and the second reference voltage are controlled based on the capacity value of the second variable capacitance section.

With the above structure, the present invention decreases a frequency control sensitivity of the local oscillator in high oscillation-frequency bands by providing multiple variable capacitive elements to which different reference voltages can be set, and switching these reference voltages. This offers substantially constant frequency control sensitivity within the entire oscillation-frequency range of the local oscillator. Accordingly, the phase noise characteristic can be improved over the broad frequency range.

If the local oscillator of the present invention is employed in configuring a receiver such as a tuner, or an electronic device for communications system, broadcast standards with a broad frequency range and communications standards with different frequency bands can be supported. In addition, good phase noise characteristic achieves transmission and reception of high-quality images, sound, and data.

BRIEF DESCRIPTION OF DRAWINGS

FIG. 7 is a block diagram of a first reference-voltage generating circuit and a second reference-voltage generating circuit in accordance with a second exemplary embodiment of the present invention.

Figure 1:
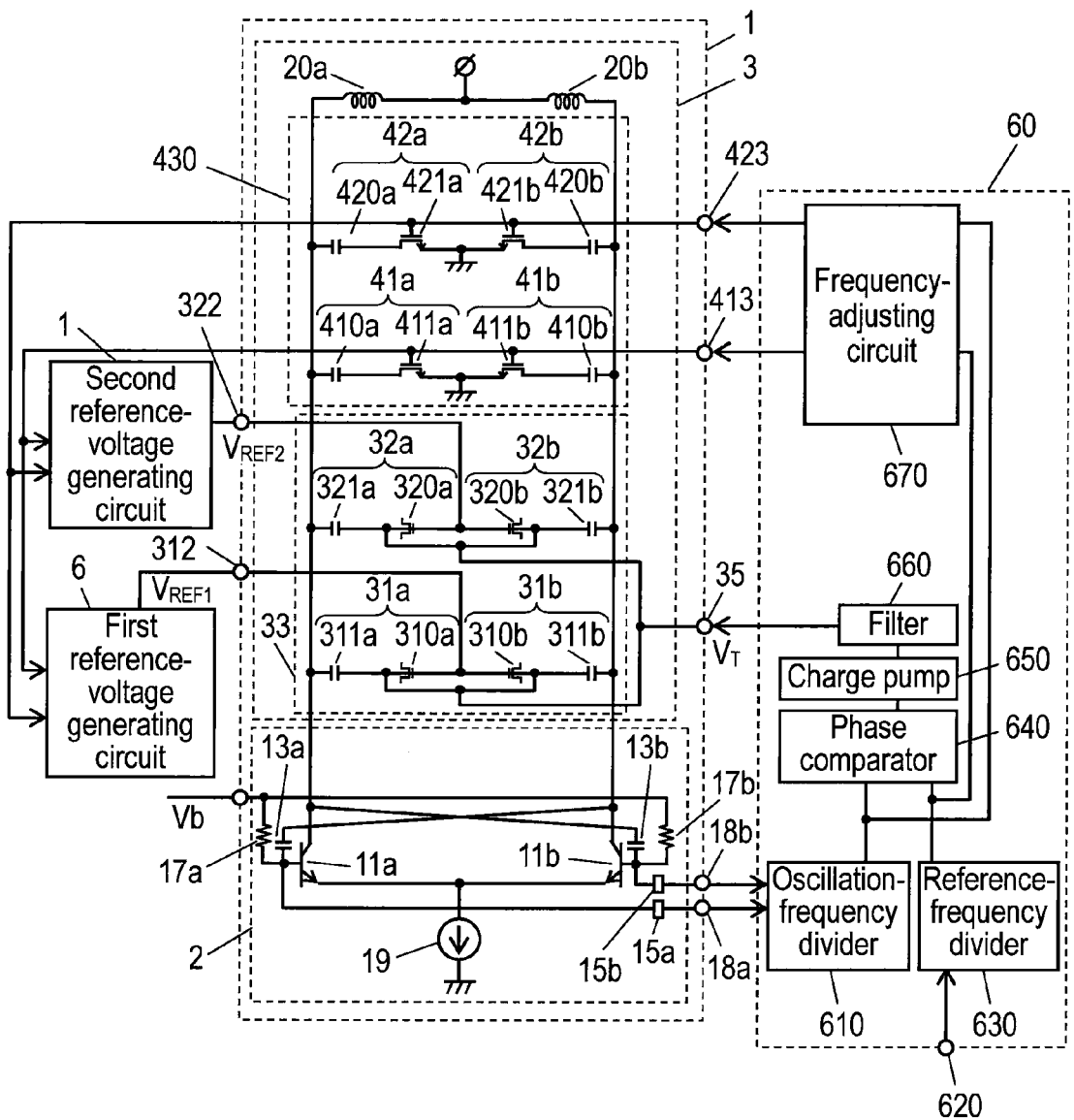
FIG. 1 is a block diagram of a local oscillator in accordance with a first exemplary embodiment of the present invention.

REFERENCE MARKS IN THE DRAWINGS 1,81 Local oscillator
2 Oscillation circuit
3 Resonance circuit
6 First reference-voltage generating circuit
7 Second reference-voltage generating circuit
11a, 11b Transistor
13a, 13b, 15a, 15b, 311a, 311b, 321a, 321b, 331a, 331b, 410a, 410b, 420a, 420b, Capacitive element
17a, 17b Resistance
18a, 18b Local oscillation signal output terminal
19 Constant current source
20a, 20b Inductor element
31a, 31b Second variable capacitance circuit
33a, 33b Third variable capacitance
33 First variable capacitance
35 Control voltage input terminal
41a, 41b First capacitance switch circuit
42a, 42b Second capacitance switch circuit
50 Third reference-voltage generating circuit
60 PLL
82 Antenna
83 Mixer
84 Demodulator
85 Signal processor
86 Playback Unit
87 Receiver
88 High-frequency amplifier
89 Intermediate-frequency amplifier
310a, 310b First variable capacitive element
312 First reference voltage terminal
320a, 320b Second variable capacitive element
322 Second reference voltage terminal
330a, 330b Third variable capacitive element
332 Third reference voltage terminal
411a, 411b First switch
413 First capacitance control terminal
421a, 421b Second switch
423 Second capacitance control terminal
430 Second variable capacitance section
600, 700 Decoder circuit
610 Oscillation-frequency divider
611 to 618, 711 to 718 Resistance
620 Reference-frequency input terminal
621 to 628, 721 to 728 Switch
630 Reference-frequency divider
640 Phase comparator
650 Charge Pump
660 Loop filter
670 Frequency-adjusting circuit
681 to 684, 781 to 784 Diode

DETAILED DESCRIPTION OF PREFERRED EMBODIMENTS

Exemplary embodiments of the present invention are described below with reference to drawings.
(First Exemplary Embodiment)
The first exemplary embodiment of the present invention is described below with reference to FIG. 1. FIG. 1 is a block diagram of a local oscillator in this exemplary embodiment.

In FIG. 1, local oscillator 1 includes oscillation circuit 2 and resonance circuit 3 connected to this oscillation circuit 2. Oscillation circuit 2 and resonance circuit 3 are connected in a loop with PLL circuit 60. A receiver (not illustrated) employing this local oscillator 1 includes a mixer (not illustrated) for converting a received signal to a intermediate-frequency signal using a local signal output from local oscillation signal output terminals 18a and 18b of local oscillator 1, and a demodulator (not illustrated) for demodulating an intermediate-frequency signal output from this mixer. An electronic device (not illustrated) employing this local oscillator 1 includes a signal processor connected to an output side of this demodulator, and a display unit (not illustrated) such as a liquid crystal display or a sound playback unit (not illustrated) such as a speaker.

Resonance circuit 3 includes inductor elements 20a and 20b connected to oscillation circuit 2. Inductor elements 20a and 20b are connected in series, and their contact point is connected to VCC. Resonance circuit 3 further includes first variable capacitance section 33 and second variable capacitance section 430 that are connected in parallel to this first variable capacitance section 33.

First variable capacitance section 33 includes first variable capacitance circuits 31a and 31b and second variable capacitance circuits 32a and 32b that are connected in parallel to inductor elements 20a and 20b.

First variable capacitance circuits 31a and 31b include variable capacitive elements (first variable capacitive elements) 310a and 310b for changing the capacity value based on control voltage $V_T$ supplied from control voltage input terminal 35 and first reference voltage $V_{REF1}$ supplied from first reference-voltage generating circuit 6 via first reference voltage terminal 312. First variable capacitance circuits 31a and 31b also include capacitive elements (first capacitive elements) 311a and 311b that are connected in series to variable capacitive elements 310a and 310b. Variable capacitive elements 310a and 310b are connected in series, and their contact point is connected to first reference voltage terminal 312. In the same way, variable capacitive element 310*b* and capacitive element 311*b* are connected in series, and their contact point is connected to control voltage input terminal 35. Capacitive elements 311*a* and 311*b* galvanically separates voltage applied from VCC via inductor elements 20*a* and 20*b* and voltage applied from control voltage input terminal 35 via variable capacitive elements 310*a* and 310*b*, respectively.

Second variable capacitance circuits 32*a* and 32*b* include variable capacitive elements (second variable capacitive elements) 320*a* and 320*b* that change their capacity values based on control voltage $V_T$ supplied from control voltage input terminal 35 and second reference voltage $V_{REF2}$ supplied from second reference-voltage generating circuit 7 via second reference voltage terminal 322. Second variable capacitance circuits 32*a* and 32*b* also include capacitive elements (second capacitive elements) 321*a* and 321*b* connected in series to variable capacitive elements 320*a* and 320*b*, respectively. Variable capacitive elements 320*a* and 320*b* are connected in series, and their contact point is connected to second reference voltage terminal 322. Variable capacitive element 320*a* and capacitive element 321*a*, and variable capacitive element 320*b* and capacitive element 321*b* are connected in series, respectively. Each of their contact points is connected to control voltage input terminal 35. Capacitive elements 321*a* and 321*b* galvanically separate voltage applied from VCC via inductor elements 20*a* and 20*b* and voltage applied to variable capacitive elements 320*a* and 320*b* from control voltage input terminal 35.

Second variable capacitance section 430 includes first capacitance switch circuits 41*a* and 41*b* connected in parallel to inductor elements 20*a* and 20*b*, respectively, and second capacitance switch circuits 42*a* and 42*b* connected in parallel to first capacitance switch circuits 41*a* and 41*b*, respectively. First capacitance switch circuit 41*a* includes capacitive element (third capacitive element) 410*a* and first switch 411*a* connected in series to this capacitive element 410*a*. First switch 411*a* is turned on and off by a signal supplied from first capacitance control terminal 413. In the same way, first capacitance switch circuit 41*b* includes capacitive element (third capacitive element) 410*b* and first switch 411*b* connected in series to this capacitive element 410*b*. First switch 411*b* is turned on and off by a signal supplied from first capacitance control terminal 413. First switch 411*a* and first switch 411*b* are connected in series, and their contact point is connected to GND. Second capacitance switch circuit 42*a* includes capacitive element (fourth capacitive element) 420*a* and second switch 421*a* connected in series to this capacitive element 420*a*. Second switch 421*a* is turned on and off by a signal supplied from second capacitance control terminal 423. In the same way, second capacitance switch circuit 42*b* includes capacitive element (fourth capacitive element) 420*b* and second switch 421*b* connected in series to this capacitive element 420*b*. Second switch 421 is turned on and off by a signal supplied from second capacitance control terminal 423. Second switch 421*a* and second switch 421*b* are connected in series, and their contact point is connected to GND.

Oscillation circuit 2 includes two NPN transistors 11*a* and 11*b* connected to resonance circuit 3, two feedback capacitive elements 13*a* and 13*b*, two decoupling capacitive elements 15*a* and 15*b*, two resistances 17*a* and 17*b*, and constant current source 19, as shown in FIG. 1.

One electrode (an electrode opposite to an electrode connected to VCC) of inductor element 20*a* and a collector electrode of transistor 11*a* are connected, and one electrode (the electrode opposite to the electrode connected to VCC) and a collector electrode of transistor 11*b* are connected.

A base electrode of transistor 11*a* is connected to the collector electrode of transistor 11*b* via feedback capacitive element 13*a*. A base electrode of transistor 11*b* is connected to the collector electrode of transistor 11*a* via feedback capacitive element 13*b*. In other words, one electrode of feedback capacitive element 13*a* is connected to the base electrode of transistor 11*a*, and the other electrode is connected to the collector electrode of transistor 11*b*. In the same way, one electrode of feedback capacitive element 13*b* is connected to the base electrode of transistor 11*b*, and the other electrode is connected to the collector electrode of transistor 11*a*.

An emitter electrode of transistor 11*a* and an emitter electrode of transistor 11*b* are connected, and their contact point is connected to one terminal of constant current source 19, which is the upstream side. The other terminal of this constant current source 19 is connected to GND, which is the downstream side.

A base electrode of transistor 11*a* is connected to constant voltage source Vb via resistance 17*a*. In the same way, a base electrode of transistor 11*b* is connected to constant voltage source Vb via resistance 17*b*. A base electrode of transistor 11*a* is connected to local oscillation signal output terminal 18*a* via decoupling capacitive element 15*a*. In the same way, a base electrode of transistor 11*b* is connected to local oscillation signal output terminal 18*b* via decoupling capacitive element 15*b*.

PLL 60 includes oscillation-frequency divider 610 connected to the output side of local oscillation signal output terminal 18*a* of local oscillator 1, and reference-frequency divider 630 connected to reference-frequency input terminal 620. PLL 60 also includes phase comparator 640 for comparing a signal from oscillation-frequency divider 610 and a reference-frequency signal from reference-frequency divider 630. PLL 60 further includes charge pump circuit 650 that receives a comparison result of phase comparator 640 and supplies control voltage to control voltage input terminal 35 of local oscillator via loop filter 660. Accordingly, PLL 60 has a function of a control circuit for supplying control voltage to resonance circuit 3 based on a frequency of local signal output from oscillation circuit 2.

Next, oscillation frequency characteristic of local oscillator 1 as configured above is described.

In FIG. 1, the resonance frequency that is output in the opposite phase from the oscillation signal output terminals 18*a* and 18*b* of local oscillator 1 is the resonance frequency in the resonance circuit. This resonance frequency is determined by first variable capacitance section 33, second variable capacitance section 430, and inductors 20*a* and 20*b*. The capacity values of variable capacitive elements 310*a* and 310*b* in first variable capacitance section 33 are determined by first reference voltage $V_{REF1}$ input from first reference-voltage generating circuit 6 via first reference voltage terminal 312 and control voltage $V_T$ applied from control voltage input terminal 35. In the same way, the capacity values of second variable capacitive elements 320*a* and 320*b* are determined by second reference voltage $V_{REF2}$ input from second reference-voltage generating circuit 7 via second reference voltage terminal 322 and control voltage $V_T$ applied from control voltage input terminal 35. The capacity value of second variable capacitance section 430 is determined by how many of capacitive elements 410*a* and 410*b* and capacitive elements 420*a* and 420*b* are connected in parallel by switching on and off of first switches 411*a* and 411*b* and second switches 421*a* and 421*b*.

First switches 411a and 411b and second switches 421a and 421b are controlled by a control signal output from frequency-adjusting circuit 670 of PLL 60. This frequency-adjusting circuit 670 determines a capacity value that minimizes the frequency difference between $f_{DIV}$ and $f_{REF}$ by comparing output signal $f_{DIV}$ of oscillation-frequency divider 610 and output signal $f_{REF}$ of reference-frequency divider 630. Frequency-adjusting circuit 670 considers combinations of capacitive elements 410a and 410b and capacitive elements 420a and 420b, and controls first switches 411a and 411b and second switches 421a and 421b via first and second capacitance control terminals 413 and 423. This structure achieves a broad oscillation frequency range.

In a locked state of local oscillator 1 and PPL 60, control voltage $V_T$ is applied to control voltage input terminal 35 of local oscillator 1. The first capacitance control signal and the second capacitance control signal are thus input to first capacitance control terminal 413 and second capacitance control terminal 423.

Figure 2:
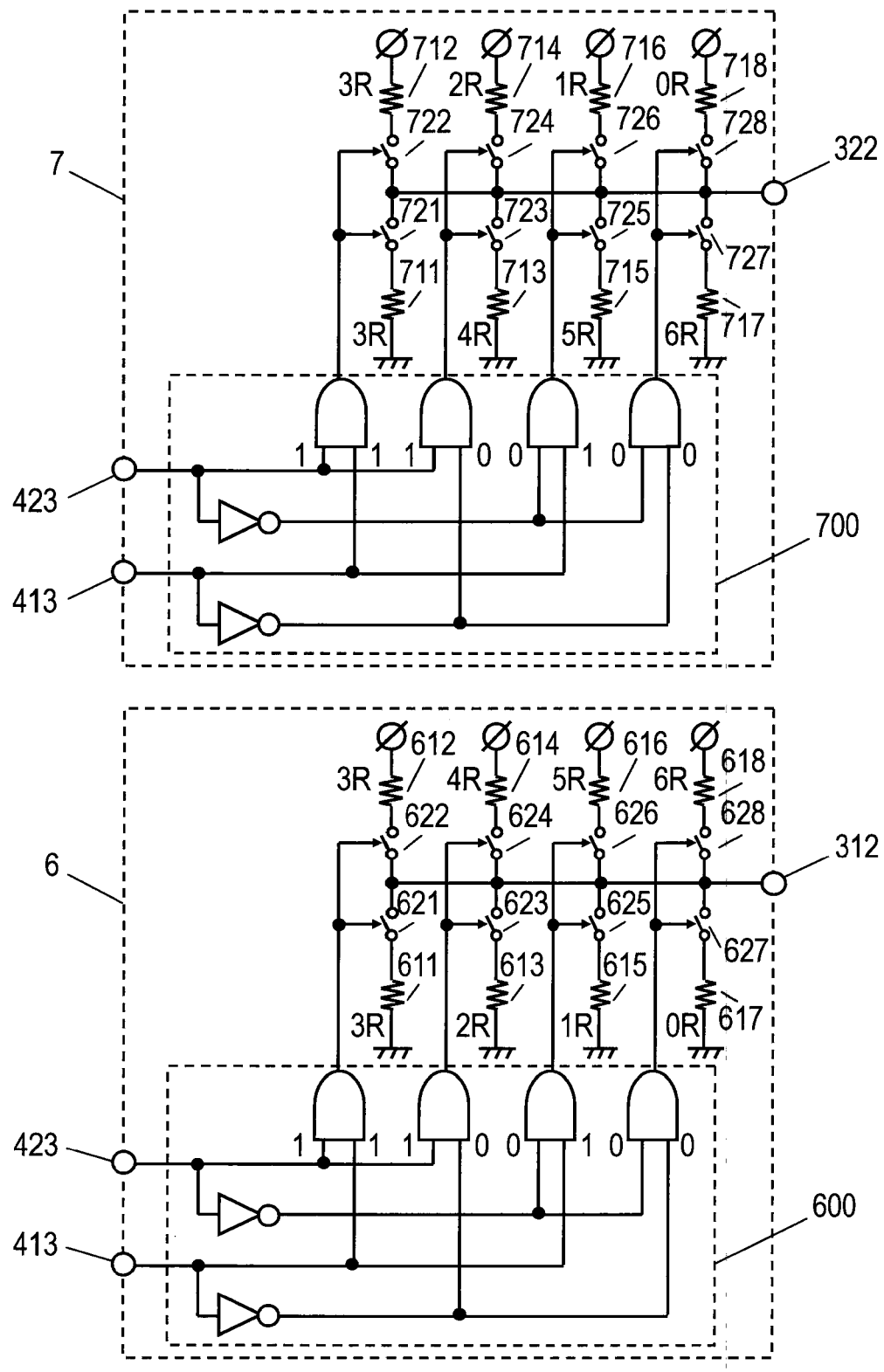
FIG. 2 is a block diagram of a first reference-voltage generating circuit and a second reference-voltage generating circuit in accordance with the first exemplary embodiment of the present invention.

Next, first reference-voltage generating circuit 6 and second reference-voltage generating circuit 7 are described with reference to FIG. 2. FIG. 2 illustrates an example of a specific structure of first reference-voltage generating circuit 6 and second reference-voltage generating circuit 7 in FIG. 1. In FIG. 2, first reference-voltage generating circuit 6 includes decoder circuit 600, resistances 611 to 618, and switches 621 to 628. Second reference-voltage generating circuit 7 also includes decoder 700, resistances 711 to 718, and switches 721 to 728.

Decoder circuits 600 and 700 decode on and off of the first capacitance control signal that is input from first capacitance control terminal 413 and on and off of second capacitance control signal that is input from second capacitance control terminal 423, and output a control signal, for example, that turns on only one pair out of four pairs of output.

Resistances 611 to 618 and switches 621 to 628 in first reference-voltage generating circuit 6 configure four pairs of voltage generating circuits in which resistance is set in different splitting ratios between VCC and GND, and $V_{REF1}$ determined by one pair of resistance splitting ratio switched on by decoder circuit 600 is output from first reference voltage terminal 312. Resistances 711 to 718 and switches 721 to 728 in second reference-voltage generating circuit 7 also configure four pairs of voltage generating circuit in which resistance is set in different splitting ratios between VCC and GND, and $V_{REF1}$ determined by one pair of resistance splitting ratio switched on by decoder circuit 700 is output from second reference voltage terminal 322.

Table 1 shows an example of setting of I/O signals of first reference-voltage generating circuit 6 and second reference-voltage generating circuit 7 in FIG. 2.

In Table 1, there are four pairs of combination of first capacitance control signal and second capacitance control signal for "input", and examples of voltage setting for first reference voltage $V_{REF1}$ and second reference voltage $V_{REF2}$ are shown in "output." The "setting of second variable capacitance" shows capacity values of second variable capacitance section 430 in bands 1 to 4.

Figure 3:
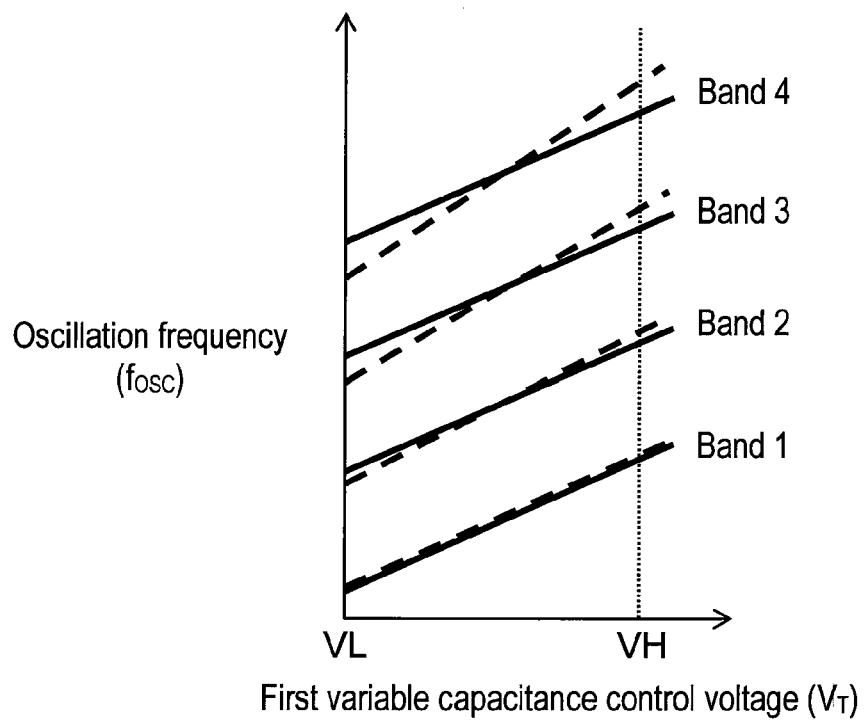
FIG. 3 is a graph illustrating frequency characteristic in accordance with the first exemplary embodiment of the present invention.

FIG. 3 is a graph illustrating frequency characteristic of local oscillator 1, which shows the relationship between first variable capacitance control voltage ($V_T$) applied to control voltage input terminal 35 and oscillation frequency ($f_{OSC}$) of local oscillator 1.

In FIG. 3, bands 1 to 4 show the characteristic of $V_T$ against $f_{OSC}$ when on and off of first switches 411a and 411b and second switches 421a and 421b are combined in four ways.

A bold line for each of bands 1 to 4 shows the characteristic that frequency control sensitivity of $V_T$ against $f_{OSC}$ is substantially the same level in all bands 1 to 4. A dotted line for each of bands 1 to 4 shows the characteristic that frequency control sensitivity of $V_T$ against $f_{OSC}$ becomes higher for bands with higher $f_{OSC}$ in bands 1 to 4, which is the characteristic of conventional local oscillator 10.

Figure 4:
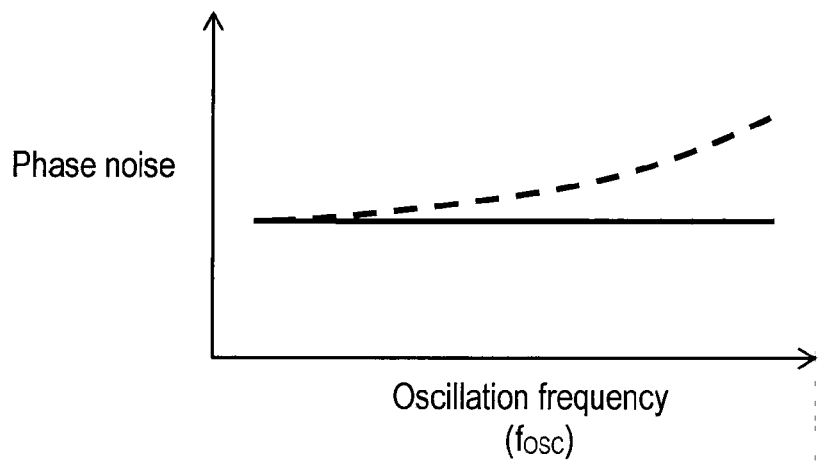
FIG. 4 is a graph illustrating noise characteristic in accordance with the first exemplary embodiment of the present invention.

FIG. 4 is a graph illustrating phase noise characteristic of local oscillator 1 in FIG. 1, which shows the relationship between oscillation frequency ($f_{OSC}$) of local oscillator 1 and phase noise. A bold line and dotted line in FIG. 4 show the difference between two types of frequency characteristic shown in FIG. 3. More specifically, the bold line is the phase noise characteristic of this exemplary embodiment when frequency control sensitivity of $V_T$ against $f_{OSC}$ is substantially the same level in all bands 1 to 4. The phase noise is substantially constant over a broad frequency range. On the other hand, the dotted line is the conventional phase noise characteristic when frequency control sensitivity of $V_T$ against $f_{OSC}$ increases for bands with higher $f_{OSC}$ in bands 1 to 4. The phase noise increases as oscillation frequency becomes higher and frequency control sensitivity becomes higher.

In this exemplary embodiment, local oscillator 1 switches the capacity value of second variable capacitance section 430 and the capacity value of first variable capacitance section 33 relative to one another by the first control signal and second control signal output to first capacitance control terminal 413 and second capacitance control terminal 423 from frequency-adjusting circuit 670 of PLL 60. This achieves the setting that the capacity value of first variable capacitance section 33 changes in a small level against control voltage $V_T$ as the capacity value of second variable capacitance section 430 becomes smaller (higher oscillation frequency band). Accordingly, the characteristic shown by the dotted line in FIGS. 3 and 4 can be adjusted to the characteristic shown by the bold line. In other words, the frequency control sensitivity

TABLE 1

| Input | | Output | | | |
|---|---|---|---|---|---|
| First capacitance control signal | Second capacitance control signal | First reference voltage $V_{REF1}$ | Second reference voltage $V_{REF2}$ | Setting of second variable capacitance section | |
| | | | | Band | Capacity value |
| OFF | OFF | GND | VCC | 4 | 0 |
| OFF | ON | 1/6 × VCC | 5/6 × VCC | 3 | 1/2 × $C_{SW1}$ (=$C_{SW2}$) |
| ON | OFF | 2/6 × VCC | 4/6 × VCC | 2 | $C_{SW1}$ |
| ON | ON | 3/6 × VCC | 3/6 × VCC | 1 | 3/2 × $C_{SW1}$ (=$C_{SW1}$ + $C_{SW2}$) | can be set to substantially the same level in all bands 1 to 4, and thus the phase noise characteristic can be kept at substantially the same level over a broad frequency range.

FIGS. 5A to 5D are graphs illustrating a change in capacity value of first variable capacitance section 33 in bands 1 to 4 shown in FIG. 3, respectively. It shows the relationship between control voltage $V_T$ applied to control voltage input terminal and the capacity value of first variable capacitance section 33. From the top row, these drawings show the capacity values of variable capacitance circuits 32a and 32b, the capacity values of first variable capacitance circuits 31a and 31b, and the capacity value of the entire first variable capacitance section 33. A practical use range of control voltage $V_T$ in FIGS. 5A to 5D is a range between VL and VH.

Bands 1 to 4 in FIGS. 5A to 5D differ with respect to voltage setting of first reference voltage $V_{REF1}$ and second reference voltage $V_{REF2}$. First reference voltage $V_{REF1}$ and second reference voltage $V_{REF2}$ set in each band are output voltages of first reference-voltage generating circuit 6 and second reference-voltage generating circuit 7 shown in Table 1.

The horizontal axis in FIGS. 5A to 5D is control voltage $V_T$. Control voltage $V_T$ is applied to each contact point where back gates of first variable capacitive elements 310a and 310b and second variable capacitive elements 320a and 320b are connected. First reference voltage $V_{REF1}$ and second reference voltage $V_{REF2}$ are also applied to each contact point where their gates are connected. Accordingly, each capacity value decreases as control voltage $V_T$ increases. Each capacity value decreases, by contraries, as first reference voltage $V_{REF1}$ and second reference voltage $V_{REF2}$ increase.

Figure 5:
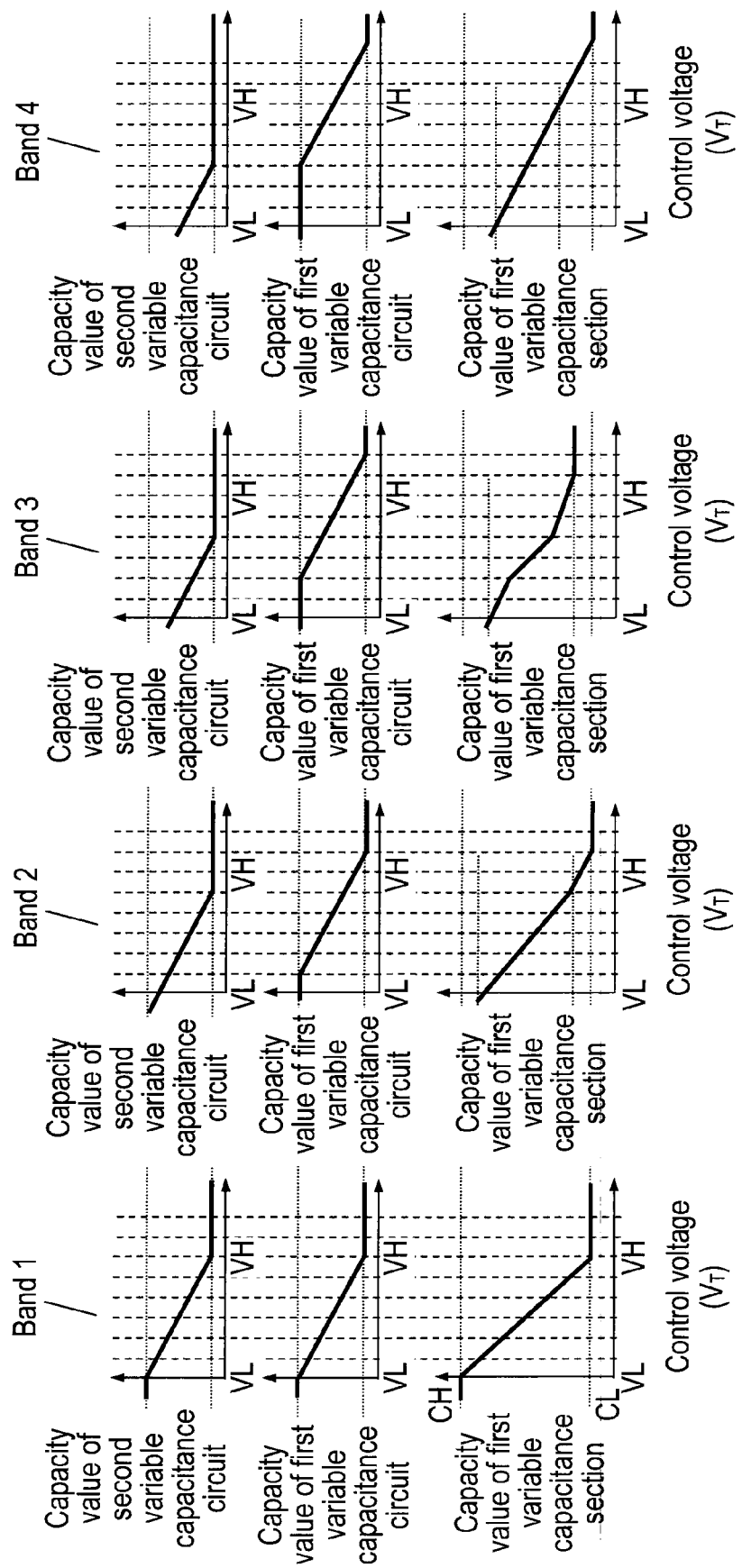
FIG. 5A is a graph illustrating changes in a capacity value of a first variable capacitance section in band 1 in accordance with the first exemplary embodiment of the present invention.
FIG. 5B is a graph illustrating changes in a capacity value of the first variable capacitance section in band 2 in accordance with the first exemplary embodiment of the present invention.
FIG. 5C is a graph illustrating changes in a capacity value of the first variable capacitance section in band 3 in accordance with the first exemplary embodiment of the present invention.
FIG. 5D is a graph illustrating changes in a capacity value of the first variable capacitance section in band 4 in accordance with the first exemplary embodiment of the present invention.

Band 1, shown in FIG. 5A, shows the state in which the capacity value of first variable capacitance section 33 changes most. The voltage is set based on $V_{REF1}=V_{REF2}=(3/6)\times VCC$. The capacity values of first variable capacitance circuits 31a and 3b and second variable capacitance circuits 32a and 32b can be changed over the entire practical range of use (VL to VH) of control voltage $V_T$. Accordingly, the capacitance of first variable capacitance section 33, configured by connecting in parallel first variable capacitance circuits 31a and 31b and second variable capacitance circuit 32a and 32b, can be widely varied.

Next, Band 2, shown in FIG. 5B, has the voltage set based on $V_{REF1}=(2/6)\times VCC$ and $V_{REF2}=(4/6)\times VCC$. The voltages of $V_{REF1}$ and $V_{REF2}$ are reversed with respect to polarity for $(1/6)\times VCC$ from Band 1, respectively. The capacitance of first variable capacitance circuits 31a and 31b and second variable capacitance circuits 32a and 32b saturates at near VL and VH, respectively, and thus the capacitance change of first variable capacitance section 33 is smaller than that of Band 1.

In the same way, in Band 3, shown in FIG. 5C, the voltages of $V_{REF1}$ and $V_{REF2}$ are reversed with respect to polarity for $(1/6)\times VCC$ from Band 2, respectively. In Band 4, shown in FIG. 5D, the voltages of $V_{REF1}$ and $V_{REF2}$ are reversed with respect to polarity for $(1/6)\times VCC$ from Band 3. Accordingly, the capacitance change of first variable capacitance circuits 31a and 31b and second variable capacitance circuits 32a and 32b saturates at near VL and VH, respectively, and thus the capacitance change of first variable capacitance section 33 becomes even smaller.

In other words, as shown in FIGS. 5A to 5D, first variable capacitance section 33 can vary the relationship of capacitance change against control voltage $V_T$ by reversing the polarity of first and second reference voltages $V_{REF1}$ and $V_{REF2}$.

Formulae 10 to 12 are derived from Formulae 5 to 8 for expressing the relationship between control voltage $V_T$ of first variable capacitance section 33 and its capacitance change to be set when frequency control sensitivities of bands 1 to 4 are approximately the same. The relationship between control voltage $V_T$ and capacitance change is expressed by $\alpha V_t + \beta$.

The relationship of coefficients $\alpha 1$ to $\alpha 4$ and $\beta 1$ to $\beta 4$ in bands 1 to 4 to which different first and second reference voltages $V_{REF1}$ and $V_{REF2}$ are applied can be set to those indicated in Formulae 10 to 12.

$$\frac{df_{OSC2}/dV_T}{df_{OSC1}/dV_T} = \quad\text{[Formula 10]}$$

$$\left\{\frac{\frac{3}{2}C_{SW1}(C1+\alpha_1 V_T+\beta_1)+C1(\alpha_1 V_T+\beta_1)}{C_{SW1}(C1+\alpha_2 V_T+\beta_2)+C1(\alpha_2 V_T+\beta_2)}\right\}=1$$

$$\alpha_2 V_T+\beta_2 = \left(\frac{3C_{SW1}+2C1}{2C_{SW1}+2C1}\right)\alpha_1 V_T +$$

$$\left(\frac{3C_{SW1}+2C1}{2C_{SW1}+2C1}\beta_1 - \frac{C_{SW1}\cdot C1}{2C_{SW1}+2C1}\right)$$

$$\therefore \alpha_2 = \left(\frac{3C_{SW1}+2C1}{2C_{SW1}+2C1}\right)\alpha_1,$$

$$\beta_2 = \left(\frac{3C_{SW1}+2C1}{2C_{SW1}+2C1}\beta_1 - \frac{C_{SW1}\cdot C1}{2C_{SW1}+2C1}\right)$$

$$\frac{df_{OSC3}/dV_T}{df_{OSC1}/dV_T} = \quad\text{[Formula 11]}$$

$$\left\{\frac{\frac{3}{2}C_{SW1}(C1+\alpha_1 V_T+\beta_1)+C1(\alpha_1 V_T+\beta_1)}{\frac{1}{2}C_{SW1}(C1+\alpha_3 V_T+\beta_3)+C1(\alpha_3 V_T+\beta_3)}\right\}=1$$

$$\alpha_3 V_T+\beta_3 =$$

$$\left(\frac{3C_{SW1}+2C1}{C_{SW1}+2C1}\right)\alpha_1 V_T+\left(\frac{3C_{SW1}+2C1}{C_{SW1}+2C1}\beta_1-\frac{2C_{SW1}\cdot C1}{C_{SW1}+2C1}\right)$$

$$\therefore \alpha_3 = \left(\frac{3C_{SW1}+2C1}{C_{SW1}+2C1}\right)\alpha_1,$$

$$\beta_3 = \left(\frac{3C_{SW1}+2C1}{C_{SW1}+2C1}\beta_1-\frac{2C_{SW1}\cdot C1}{C_{SW1}+2C1}\right)$$

$$\frac{df_{OSC4}/dV_T}{df_{OSC1}/dV_T} = \quad\text{[Formula 12]}$$

$$\left\{\frac{\frac{3}{2}C_{SW1}(C1+\alpha_1 V_T+\beta_1)+C1(\alpha_1 V_T+\beta_1)}{C1(\alpha_4 V_T+\beta_4)}\right\}=1$$

$$\alpha_4 V_T+\beta_4 = \left(\frac{3C_{SW1}+2C1}{2C1}\right)\alpha_1 V_T +$$

$$\left(\frac{3C_{SW1}+2C1}{2C1}\beta_1-\frac{3C_{SW1}}{2}\right)$$

$$\therefore \alpha_4 = \left(\frac{3C_{SW1}+2C1}{2C1}\right)\alpha_1$$

$$\beta_4 = \left(\frac{3C_{SW1}+2C1}{2C1}\beta_1-\frac{3C_{SW1}}{2}\right)$$

Provision of multiple variable capacitive elements to which different reference voltages can be set enables lowering of frequency control sensitivity of the local oscillator in high oscillation frequency bands by switching these reference voltages. This achieves substantially constant frequency control sensitivity over the entire oscillation frequency range of the local oscillator. Accordingly, the phase noise characteristic can be improved over the broad frequency range.

In FIG. 1, two pairs, which are first capacitance switch circuits 41a and 41b and second capacitance switch circuits 42a and 42b, are used for second variable capacitance section 430. However, the number of pairs, values of capacitive elements 410a and 410b, and capacity values of capacitive elements 420a and 420b may be appropriately selected in accordance with a predetermined range of oscillation frequency.

FIG. 1 refers to the structure that employs two pairs for first variable capacitance section 33: First variable capacitive elements 310a and 310b and second variable capacitive elements 320a and 320b. However, three or more pairs may also be used.

Figure 6:
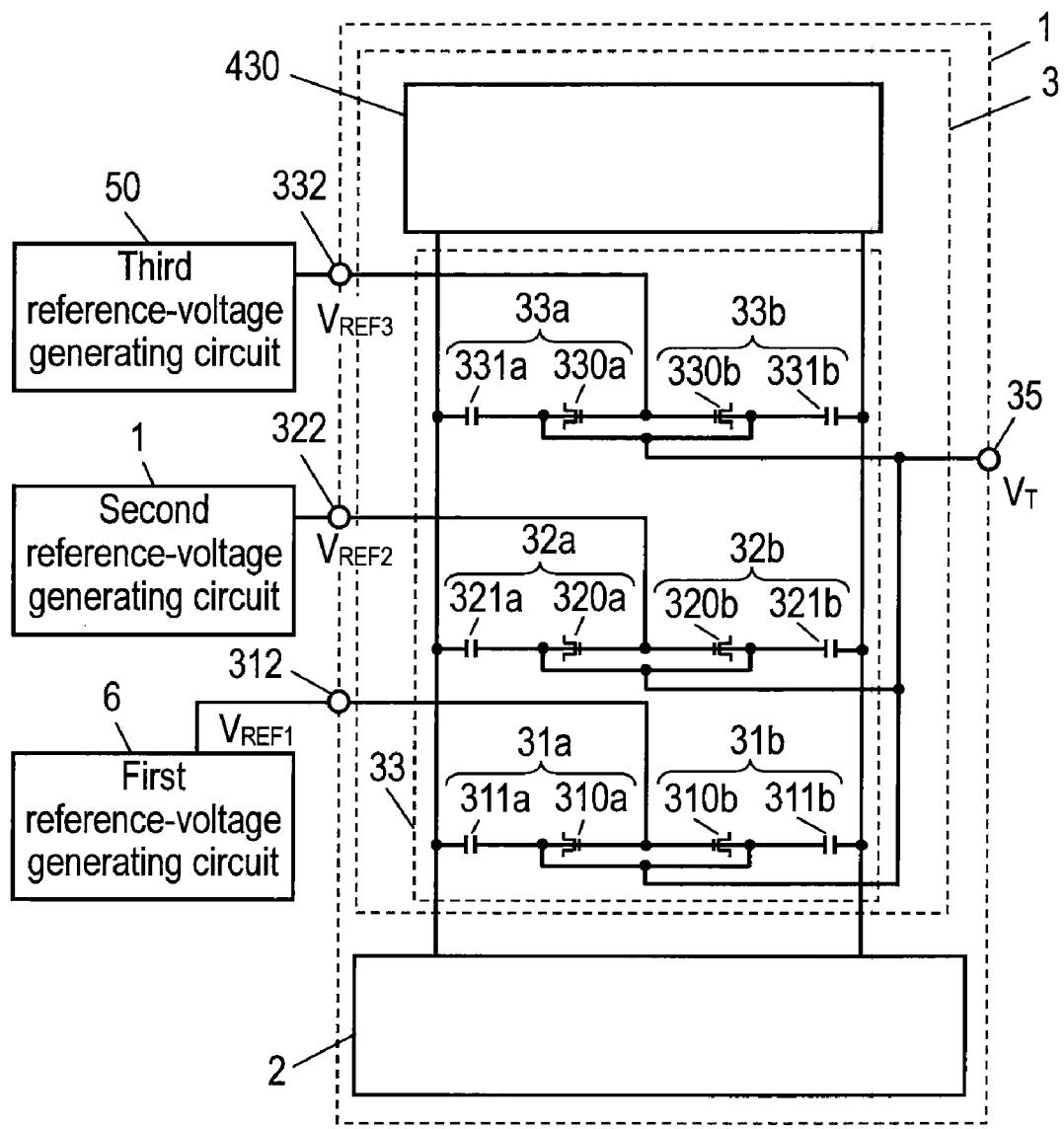
FIG. 6 is a block diagram of another example of the first variable capacitance section in accordance with the first exemplary embodiment of the present invention.

For example, as shown in FIG. 6, third reference-voltage generating circuit 50 may be provided so as to output third reference voltage $V_{REF3}$ from third reference voltage terminal 332 in accordance with the first control signal and the second control signal. This third reference voltage $V_{REF3}$ and control voltage $V_T$ from control voltage input terminal 35 are applied to each terminal. Third variable capacitance circuits 33a and 33b connected in parallel to first variable capacitance circuits 31a and 31b and second variable capacitance circuits 32a and 32b are added. Third variable capacitance circuit 33a includes, same as first variable capacitance circuit 31a and second variable capacitance circuit 32a, third variable capacitive elements 330a for changing the capacity value based on control voltage $V_T$ and reference voltage $V_{REF3}$. In addition, capacitive element 331a connected in series to first variable capacitive element 330a is provided. In the same way, third variable capacitive element 330b for changing the capacity value based on control voltage $V_T$ and reference voltage $V_{REF3}$ is provided on third variable capacity circuit 33b, same as first variable capacitance circuit 31b and second variable capacitance circuit 32b. Capacitive element 331b connected in series to first variable capacitive element 330b is also provided.

In this structure, the capacitance change with respect to control voltage $V_T$ of third variable capacitive elements 330a and 330b added is controlled independently from first variable capacitive elements 310a and 310b and second variable capacitive elements 320a and 320b. Accordingly, the frequency control sensitivity of local oscillator can be even more finely adjusted. This enables improvement of the phase noise characteristic over an even broader frequency range.

(Second Exemplary Embodiment)

The second exemplary embodiment of the present invention is described below with reference to FIG. 7. Components that are the same as those in the first exemplary embodiment are given the same reference marks. Only the point that differs is described. FIG. 7 shows first reference-voltage generating circuit 6 and second reference-voltage generating circuit 7 in the second exemplary embodiment.

First reference-voltage generating circuit 6 and second reference-voltage generating circuit 7 in FIG. 7 are configured with diodes 681 to 684 and 781 to 784 in four pairs of voltage generating circuits, respectively, whose resistance-splitting ratios are different between VCC and GND. This point is different from the first exemplary embodiment.

To configure a circuit for generating a predetermined voltage in a semiconductor, a diode is generally used to prevent any unnecessary increase in current consumption and any increase in circuit scale due to the need for resistors as shown in FIG. 2.

First reference-voltage generating circuit 6 includes four groups of voltage generating circuits in which resistances 611 to 618, switches 621 to 628, and diodes 681 to 684 are connected in series, respectively. For example, if one group of voltage generating circuits, in which resistance 612 (R1), diode 681, switch 622, switch 621, and resistance 611 (R2) are connected in series from the VCC side to GND side is selected, first reference voltage $V_{REF1}$ indicated in Formula 13 is output from the point where switch 622 and switch 621 are connected.

In Formula 13, voltage changes in the forward direction with respect to a temperature change according to voltage $V_{BE}$ generated in diode 681 between the base and emitter.

$$V_{REF1} = \frac{(VCC - V_{BE})R2}{R1 + R2} = \frac{VCC \cdot R2 - V_{BE} \cdot R2}{R1 + R2} \quad \text{[Formula 13]}$$

In the same way, second reference-voltage generating circuit 7 includes four groups of voltage generating circuits in which resistances 711 to 718, switches 721 to 728, and diodes 781 to 784 are connected in series, respectively. For example, if one group of voltage generating circuits, in which resistance 712 (R1), switch 722, switch 721, diode 781, and resistance 711 (R2) are connected in series from the VCC side to GND side is selected, second reference voltage $V_{REF2}$ indicated in Formula 14 is output from the point where switch 22 and switch 721 are connected.

In Formula 14, voltage changes in the reverse direction with respect to a temperature change according to voltage $V_{BE}$ generated in diode 781 between the base and emitter.

$$V_{REF2} = \frac{(VCC - V_{BE})R2}{R1 + R2} + V_{BE} = \frac{VCC \cdot R2 + V_{BE} \cdot R1}{R1 + R2} \quad \text{[Formula 14]}$$

In the above structure, the polarities of first reference voltage $V_{REF1}$ and second reference voltage $V_{REF2}$ are reversed with respect to temperature. First variable capacitance section 33 including first variable capacitance circuits 31a and 31b and second variable capacitance circuits 32a and 32b, to which first reference voltage $V_{REF1}$ and second reference voltage $V_{REF2}$ are applied, show the capacity value with small temperature fluctuations. Accordingly, the temperature fluctuation of oscillation frequency output from local oscillator 1 can be reduced.

Figure 8:
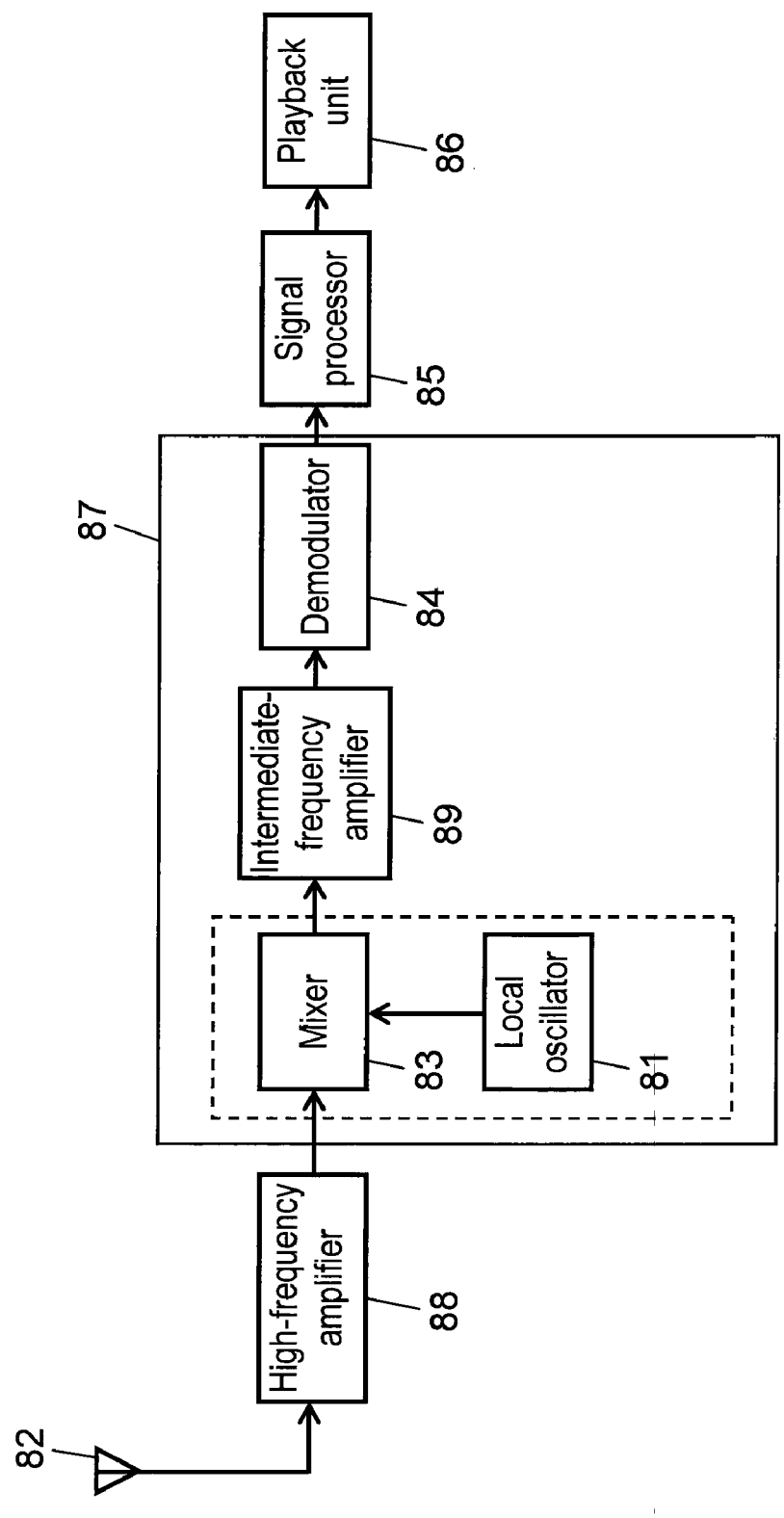
FIG. 8 is a schematic diagram of an electronic device in accordance with an exemplary embodiment of the present invention.
Figure 9:
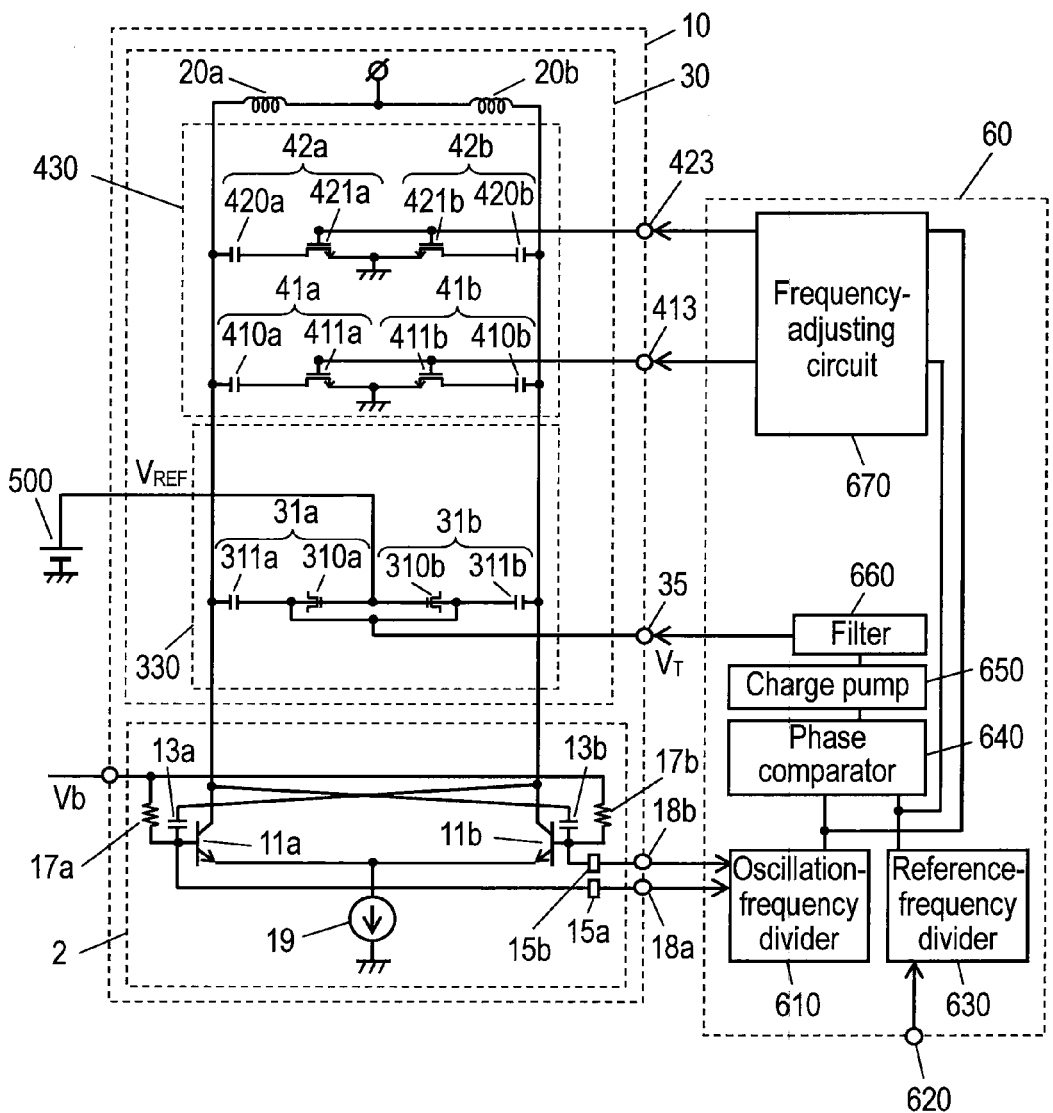
FIG. 9 is a block diagram of a conventional local oscillator.
Figure 10:
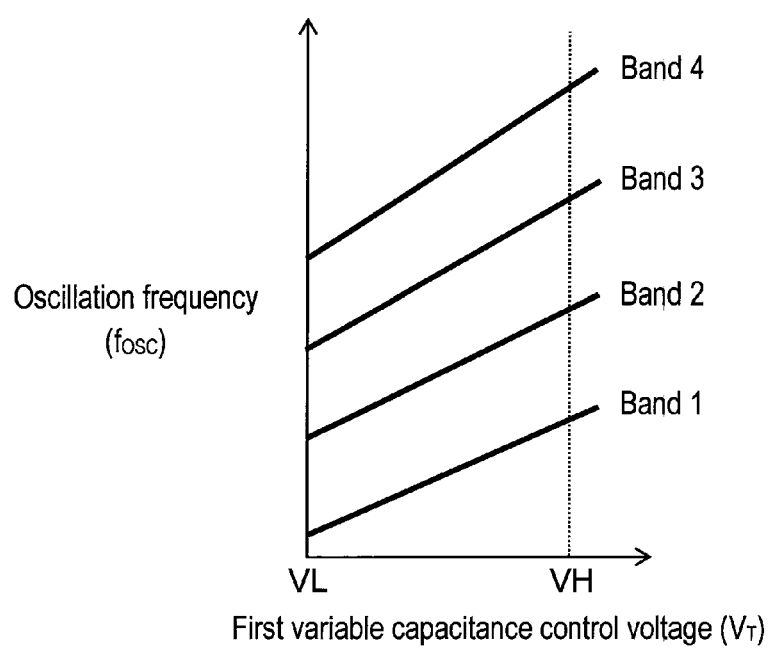
FIG. 10 is a graph illustrating frequency characteristic in accordance with the conventional local oscillator.

FIG. 8 is a schematic diagram of an embodiment of electronic device of the present invention equipped with a receiver using the local oscillator in the first exemplary embodiment or the second exemplary embodiment.

FIG. 8 shows a TV broadcast receiver as one embodiment of the electronic device. The TV broadcast receiver in this exemplary embodiment includes local oscillator 81 described in the first exemplary embodiment or the second exemplary embodiment. The TV broadcast receiver in this exemplary embodiment also includes mixer 83 for converting the incoming signal received by antenna 82 to an intermediate-frequency signal by using a local signal output from local oscillator 81. The TV broadcast receiver in this exemplary embodiment also includes demodulator 84 for demodulating the intermediate-frequency signal output from this mixer 83. The TV broadcast receiver in this exemplary embodiment further includes signal processor 85 connected to the output side of demodulator 84, and playback unit 86 including a speaker and display device connected to the output side of signal processor 85.

Receiver 87 of the present invention is configured with local oscillator 81, mixer 83, and demodulator 84.

In FIG. 8, high-frequency amplifier 88 is connected between antenna 82 and mixer 83, and intermediate-frequency amplifier 89 is connected between mixer 83 and demodulator 84.

In this exemplary embodiment, as described in the first and second exemplary embodiments, high-quality images and sound are produced by achieving a good phase noise characteristic over a broad frequency range.

In the same way, if a tuner is configured with the receiver using the local oscillator described in the first exemplary embodiment or the second exemplary embodiment, broadcasts over a broad frequency range can be received, and high-quality images and sound can be produced thanks to good phase noise characteristic.

Furthermore, if a communications system is configured with the electronic device using the local oscillator described in the first exemplary embodiment or the second exemplary embodiment, the system is applicable to communications standards for different frequency bands, and high-quality images, sound, and data can be transmitted and received thanks to good phase noise characteristic.

Industrial Applicability

The local oscillator of the present invention achieves a broad oscillation frequency range and good phase noise characteristic at the same time, and is applicable to electronic device such as mobile terminals and TV broadcast receiver for vehicles. For example, the present invention is applicable to a tuner that needs to receive broadcasts over a broad frequency range and reproduce high-quality images, sound, and data. The present invention is also applicable to communications systems that require supporting of communications standards with different frequency bands and the transmission and reception of high-quality images, sound, and data.

The invention claimed is:

1. A local oscillator comprising:
an oscillation circuit; and
a resonance circuit connected to the oscillation circuit, the resonance circuit comprising:
an inductor element connected to the oscillation circuit; a first variable capacitance section connected to the inductor element; and a second variable capacitance section connected in parallel to the first variable capacitance section; the first variable capacitance section comprising:
a first variable capacitive element connected to the inductor element, the first variable capacitive element changing its capacity value based on a control voltage and a first reference voltage; and a second variable capacitive element connected in parallel to the first variable capacitive element, the second variable capacitive element changing its capacity value based on the control voltage and a second reference voltage;
wherein,
the first reference voltage and the second reference voltage are controlled based on a capacity value of the second variable capacitance section.

2. The local oscillator of claim 1, the first variable capacitance section further comprising a first capacitive element connected in series to the first variable capacitive element, and a second capacitive element connected in series to the second variable capacitive element.

3. The local oscillator of claim 1, wherein the second variable capacitance section comprises a third capacitive element connected in parallel to the inductor element, a first switch element connected in series to the third capacitive element, a fourth capacitive element connected in parallel to the inductor element, and a second switch element connected in series to the fourth capacitive element.

4. The local oscillator of claim 1, the first variable capacitance section further comprising a third variable capacitance circuit connected in parallel to the first variable capacitive element, the third variable capacitive element changing its capacity value based on the control voltage and a third reference voltage;

wherein,
the first reference voltage, the second reference voltage, and the third reference voltage are controlled based on the capacity value of the second variable capacitance section.

5. The local oscillator of claim 1, comprising a first reference-voltage generating circuit for generating the first reference voltage based on the capacity value of the second variable capacitance section, and outputting the first reference voltage to the first variable capacitive element; and a second reference-voltage generating circuit for generating the second reference voltage based on the capacity value of the second variable capacitance section, and outputting the second reference voltage to the second variable capacitive element;

wherein,
polarities of the first reference voltage generated by the first reference-voltage generating circuit and the second reference voltage generated by the second reference-voltage generating circuit fluctuate in reverse directions with respect to a temperature change.

6. A receiver comprising:
an oscillation circuit;
a resonance circuit connected to the oscillation circuit, the resonance circuit comprising:
an inductor element connected to the oscillation circuit; a first variable capacitance section connected to the inductor element; and a second variable capacitance section connected in parallel to the first variable capacitance section; the first variable capacitance section comprising:
a first variable capacitive element connected to the inductor element, the first variable capacitive element changing its capacity value based on a control voltage and a first reference voltage; and a second variable capacitive element connected in parallel to the first variable capacitive element, the second variable capacitive element changing its capacity value based on the control voltage and a second reference voltage;
a control circuit supplying the control voltage to the resonance circuit based on a frequency of a local signal output from the oscillation circuit;
a mixer for converting a receiving signal to an intermediate-frequency signal using a local signal output from the oscillation circuit; and
a demodulator for demodulating the intermediate-frequency signal output from the mixer;
wherein,
the first reference voltage and the second reference voltage are controlled based on a capacity value of the second variable capacitance section.

7. An electronic device comprising:
an oscillation circuit;
a resonance circuit connected to the oscillation circuit, the resonance circuit comprising:
an inductor element connected to the oscillation circuit; a first variable capacitance section connected to the inductor element; and a second variable capacitance section connected in parallel to the first variable capacitance section; the first variable capacitance section comprising:
a first variable capacitive element connected to the inductor element, the first variable capacitive element changing its capacity value based on a control voltage and a first reference voltage; and a second variable capacitive element connected in parallel to the first variable capacitive element, the second variable capacitive element changing its capacity value based on the control voltage and a second reference voltage;
a control circuit supplying the control voltage to the resonance circuit based on a frequency of a local signal output from the oscillation circuit;
a mixer for converting a receiving signal to an intermediate-frequency signal using the local signal output from the oscillation circuit;
a demodulator connected to an output side of the mixer;
a signal processor connected to an output side of the demodulator; and
a playback unit connected to an output side of the signal processor;
wherein,
the first reference voltage and the second reference voltage are controlled based on a capacity value of the second variable capacitance section.

* * * * *